US005499160A

United States Patent [19]
Burns

[11] Patent Number: 5,499,160
[45] Date of Patent: Mar. 12, 1996

[54] HIGH DENSITY INTEGRATED CIRCUIT MODULE WITH SNAP-ON RAIL ASSEMBLIES

[75] Inventor: Carmen D. Burns, Austin, Tex.

[73] Assignee: Staktek Corporation, Austin, Tex.

[21] Appl. No.: 380,543

[22] Filed: Jan. 30, 1995

Related U.S. Application Data

[63] Continuation-in-part of Ser. No. 186,827, Jan. 24, 1994, abandoned, which is a continuation of Ser. No. 884,066, May 15, 1992, abandoned, which is a continuation-in-part of Ser. No. 561,417, Aug. 1, 1990, abandoned.

[51] Int. Cl.[6] ................................................. H05H 7/20
[52] U.S. Cl. ................. 361/704; 165/80.3; 165/185; 174/16.3; 257/719; 257/727; 361/690; 361/717; 361/790
[58] Field of Search .................. 165/80.2, 80.3, 165/185; 174/16.3; 257/718–719, 726–727; 361/690, 704, 707, 709–719, 722, 733, 735, 744, 776, 790

[56] References Cited

U.S. PATENT DOCUMENTS

| | | | |
|---|---|---|---|
| 3,746,934 | 7/1973 | Stein | 337/101 |
| 4,103,318 | 7/1978 | Schwede | 361/388 |
| 4,437,235 | 3/1984 | McIver | 29/840 |
| 4,521,828 | 6/1985 | Fanning | 361/386 |
| 4,525,921 | 7/1985 | Carson et al. | 29/577 |
| 4,680,617 | 7/1987 | Ross | 357/72 |
| 4,763,188 | 8/1988 | Johnson | 357/74 |
| 4,862,245 | 8/1989 | Pashby et al. | 357/70 |
| 4,862,249 | 8/1989 | Carlson | 357/80 |
| 4,884,237 | 11/1989 | Mueller et al. | 365/63 |
| 4,953,060 | 8/1990 | Lauffer et al. | 361/388 |
| 4,956,694 | 9/1990 | Eide | 357/74 |
| 5,016,138 | 5/1991 | Woodman | 361/381 |
| 5,243,133 | 9/1993 | Engle et al. | 174/52.4 |
| 5,307,929 | 5/1994 | Seidler | 206/331 |

FOREIGN PATENT DOCUMENTS

| | | |
|---|---|---|
| 5896756A | 6/1983 | Japan . |
| 58112348A | 7/1983 | Japan . |

OTHER PUBLICATIONS

Information allegedly written by Emory Garth regarding "Memory Stacks," Applicant received a facsimile from Emory Garth on Jan. 26, 1993, Applicant does not know when the information was written or its validity.

Catalog of Dense–Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870, no known date.

"High Density Memory Packaging Technology High Speed Imaging Applications," Dean Frew, Texas Instruments Inc., SPIE vol. 1346 *Ultrahigh–and High–Speed Photography, Photonics, and Velocimetry '90*, pp. 200–209.

(List continued on next page.)

*Primary Examiner*—Gregory D. Thompson
*Attorney, Agent, or Firm*—Fulbright & Jaworski

[57] ABSTRACT

A high density integrated circuit module which includes a plurality of stacked integrated circuit packages, wherein each package includes a casing, an integrated circuit die disposed within the casing and a plurality of electrical interconnect leads extending from the die through the casing; also including a plurality of electrically and thermally conductive vertical rails. The rails include an upper portion which extends over and is laminated to a spacer, the spacer being disposed on the upper major surface of the uppermost of the integrated circuit packages in the module, a central portion connected to the upper portion, the central portion is electrically and thermally connected to selected ones of the electrical interconnect leads, a spring-bias portion connected to the central portion, the spring-bias portion being curved to provide a spring-bias force on the rails, and a lower portion connected to the spring-bias portion, the lower portion being in surface contact with the lower major surface of the lowermost of the integrated circuit packages in the module.

17 Claims, 4 Drawing Sheets

OTHER PUBLICATIONS

"Vertically–Integrated Package," Abstract, Alvin Weinberg, W. Kinzy Jones, IEEE, pp. 436–443, not known date.

"3D Interconnection For Ultra–Dense Multichip Modules," Abstract, Christian VAL, IEEE, pp. 540–547, no known date.

HIGH DENSITY INTEGRATED CIRCUIT MODULE WITH SNAP-ON RAIL ASSEMBLIES

This application is a continuation-in-part of application Ser. No. 08/186,827 filed Jan. 24, 1994, now abandoned, which is a continuation of application Ser. No. 07/884,066 filed May 15, 1992, now abandoned, which is a continuation-in-part of application Ser. No. 07/561,417, filed Aug. 1, 1990, now abandoned.

BACKGROUND OF THE INVENTION

1. Field of the Invention

This invention relates to a high-density, three-dimensional integrated circuit module, which includes a plurality of stacked individual integrated circuit packages, and an external rail assembly for electrically interconnecting the integrated circuit packages therein to each other and to external circuitry. More particularly, this invention relates to a high-density, integrated circuit module which includes snap-on rail assemblies for interconnecting the leads of individual integrated circuit packages within the module.

2. Discussion of the Related Technology

An integrated circuit packaging method for producing a transfer molded, thin and reliable level-one package, is described in grandparent patent application, Ser. No. 07/561,417, which is incorporated herein for all purposes. As disclosed in that application, the integrated circuit packages are then bound together mechanically or by use of an epoxy or other adhesive to form a high density three-dimensional level-two package, or module.

Related parent application Ser. No. 08/186,827, incorporated herein for all purposes, discloses how these modules are electrically interconnected by utilizing rail assemblies connected to leads from the individual level-one packages in the level-two module. In applications requiring rails with complex geometry or close spacing, maintaining rail stability during the manufacturing process is problematic.

SUMMARY OF INVENTION

The present invention provides a snap-on rail assembly to provide the electrical interconnection signal path and a spring-bias portion to provide a rail mounting and positioning force on the thin rail assembly to maintain proper alignment during fabrication of high density integrated circuit modules. The modules include a plurality of stacked individual integrated circuit packages. The spring-biased snap-on rail assemblies maintain rail stability through final assembly and soldering operations.

Various embodiments of the snap-on rail assembly of the present invention are described herein. In one such embodiment, the snap-on rail assembly includes an upper portion which extends over a spacer laminated to the uppermost integrated circuit package in the module. A central portion of the rail assembly is electrically and thermally connected to selected electrical interconnect leads extending from the individual integrated circuit packages within the module. A lower portion of the rail assembly is in surface contact with the bottom surface of the lowermost of the individual integrated circuit packages in the module. A spring-biased portion, preferably between the central portion and the lower portion of the rail assembly, provides a spring-bias force to hold the rail in place during the final assembly of the module.

In another embodiment, the rail assembly includes a plurality of complex geometric individual rails or conductors for connecting the leads of alternating stacked individual integrated circuit packages within the module. The individual conductors or rails in such complex assemblies may electrically interconnect leads from every other integrated circuit package, leads of every third integrated circuit package, leads of alternating pairs of integrated circuit packages, etc. In such configurations, the complex rails may also be interconnected.

DETAILED DESCRIPTION OF THE PREFERRED EMBODIMENT

Figure 1:
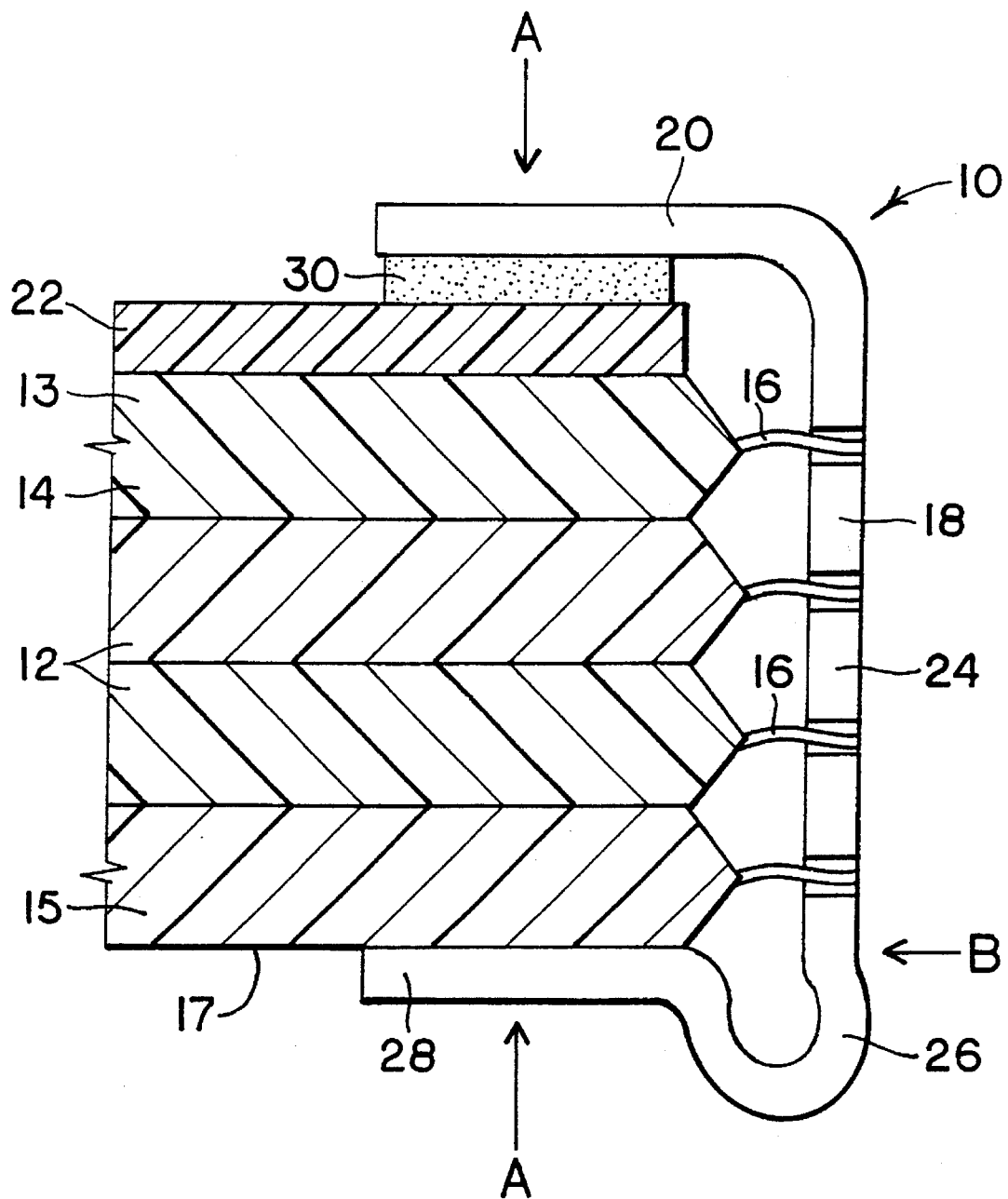
FIG. 1 is a partial cross-sectional view of an embodiment of a three-dimensional high density module of the present invention, including a snap-on rail assembly and a spacer above the module.

FIG. 1 illustrates an integrated circuit module 10 including a plurality of stacked individual integrated circuit packages 12. Each integrated circuit package 12 has a casing 14 which surrounds an integrated circuit die (not shown). Casing 14 is made of transfer molded plastic or any suitable high temperature and durable casing material. Each integrated circuit package 12 includes a plurality of standard TSOP electrical interconnect leads 16 which extend from the internal integrated circuit die through casing 14. Electrically and thermally conductive rail assemblies 18, are formed from thin copper stock, or other suitable metal. Rails 18 are formed to provide a spring-bias to clamp around module 10 in the direction of arrows A (FIG. 1). Rails are electrically coupled to selected leads 16 of integrated circuit packages 12 within module 10.

Rails 18 have an upper portion 20 which extends over the top of module 10. Upper portion 20 is adhered to an electrically insulating substantially planar spacer 22. Spacer 22 is adhered to the top surface of the uppermost integrated circuit package 13 within module 10. The adhesive 30 used to bond spacer 22 to the uppermost package 13 and to affix the upper portion 20 of rail 18 to spacer 22 may be any suitable high temperature glue, epoxy or adhesive. Such adhesives may be thermoplastic or thermosetting preferably thermoplastic which affixes when exposed to heat in the range of 240° C. to 270° C. The adhesive may be free-flowing or applied (0.6 mil) to both sides of a one-rail Kapton tape. Spacer 22 may be formed from FR-4, or any other suitable high temperature molded plastic.

Figure 5:
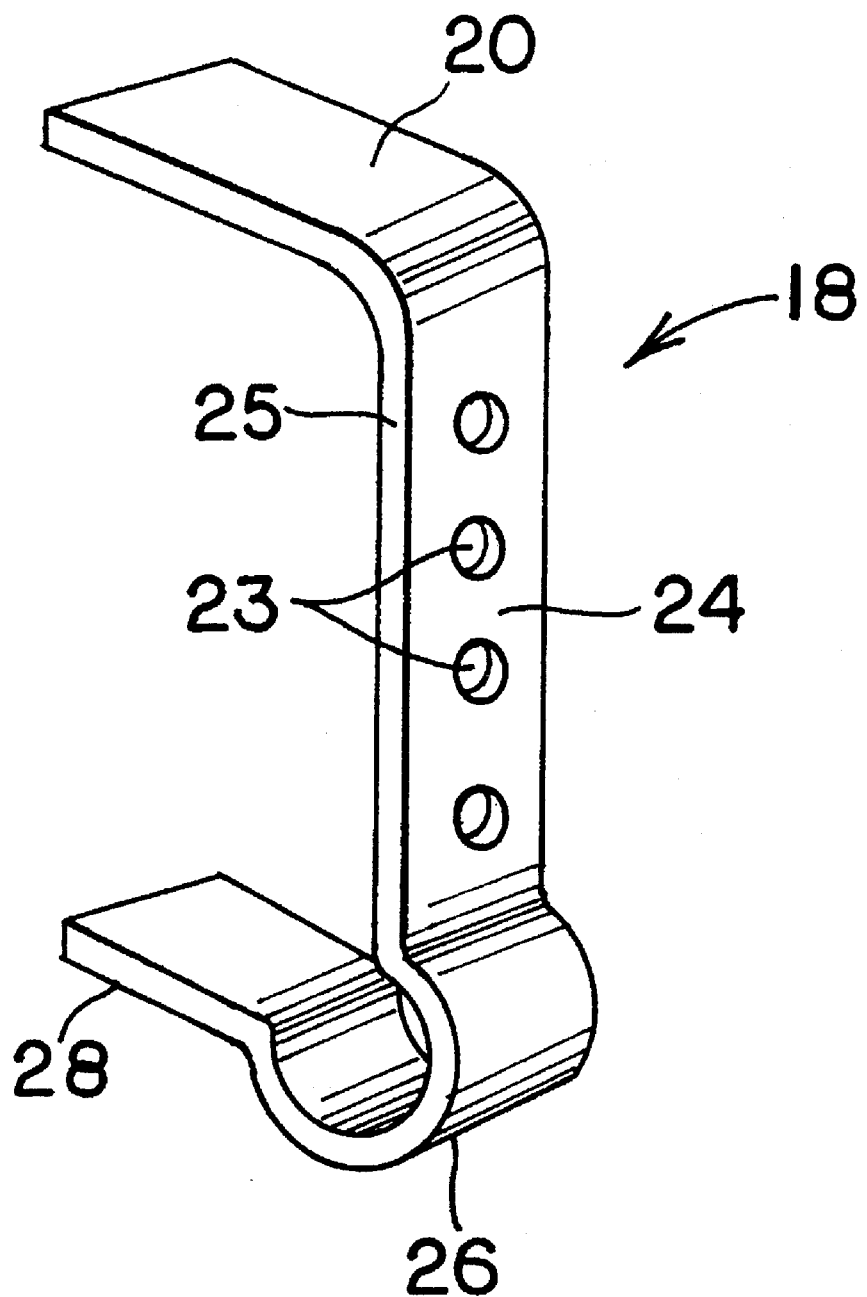
FIG. 5 is a perspective view of a portion of the rail assembly of the present invention.

Each rail 18 also has a central portion 24 which is preferably formed integrally with upper portion 20 of rail 18 and is electrically and thermally connected to selected electrical interconnect leads 16 of integrated circuit packages 12 of module 10. Leads 16 may be soldered to the edges 25 of rails 18, or may extend through apertures 23 in rails 18 to provide enhanced stability (FIG. 5). It should also be noted that rails 18 may be formed and mounted as an assembly where temporary connections between rails hold the individual rails together until after attachment to module 10 when such temporary connections are severed as part of final assembly.

Each rail 18 also includes a spring-bias portion 26 which is connected to the central portion 24 of rail 18. The spring-bias portion 26 is formed to provide both a circuit board interconnection and a spring-bias force on rail 18 in the direction indicated by arrows A (FIG. 1). Rail 18 is also formed to provide an inward spring-bias force at lower portion 28 the direction of arrow B (FIG. 1). Rail 18 also includes a lower portion 28 which is connected to the spring-bias portion 26. Lower portion 28 is in surface contact with the exterior surface of the lowermost integrated circuit package 15 in module 10, but is not adhered to it so lower portion 28 may move freely during expansion or contraction of rail 18. The spring-bias portion 26 exerts a spring-bias such that the upper portion 20 and the lower portion 28 of rail 18 provide an inward clamping force to position and stabilize rails 18 during the assembly of module 10.

Figure 2:
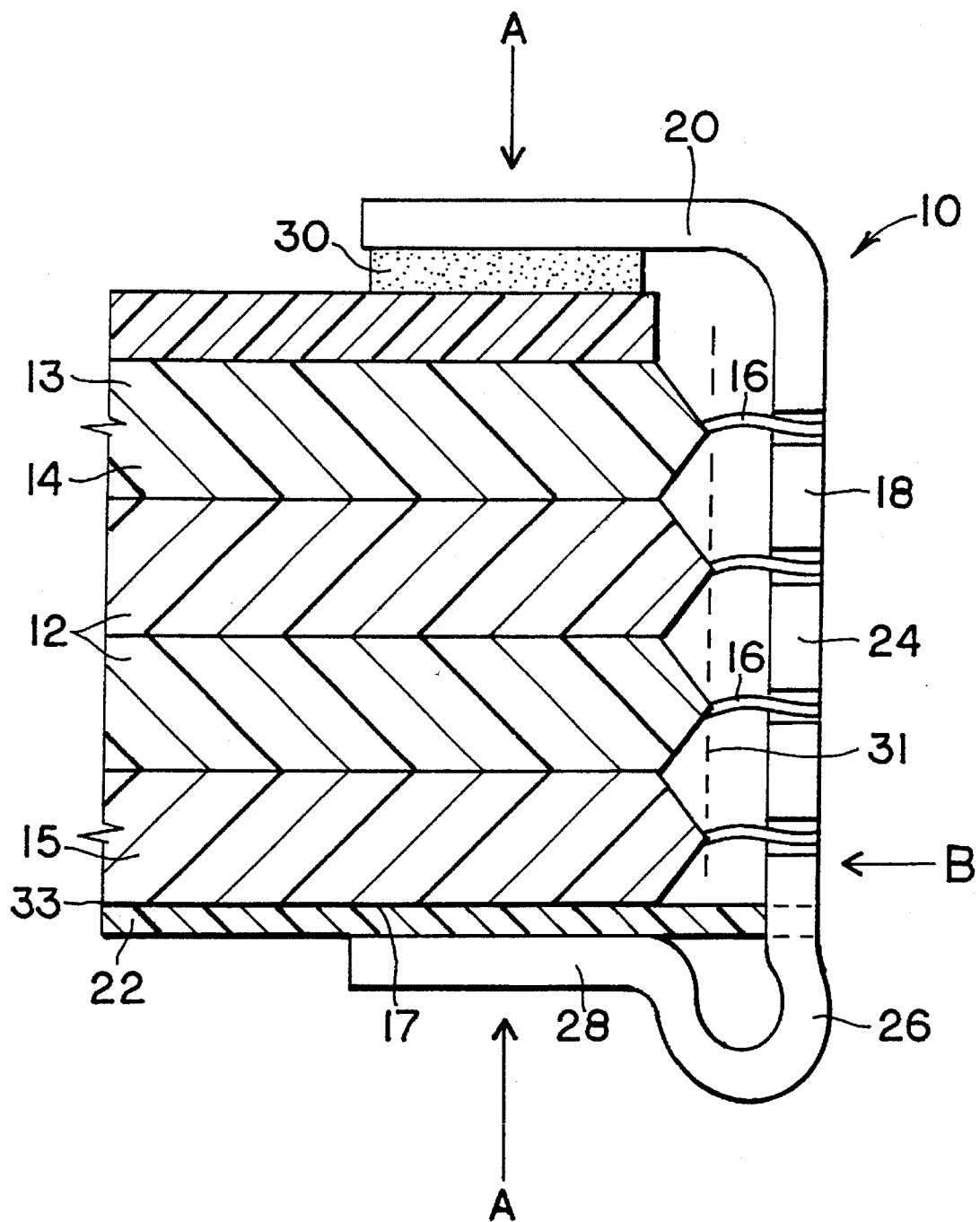
FIG. 2 is a partial cross-sectional view of another embodiment of a three-dimensional high density module of the present invention, including a snap-on rail assembly and a spacer below the module.
Figure 3:
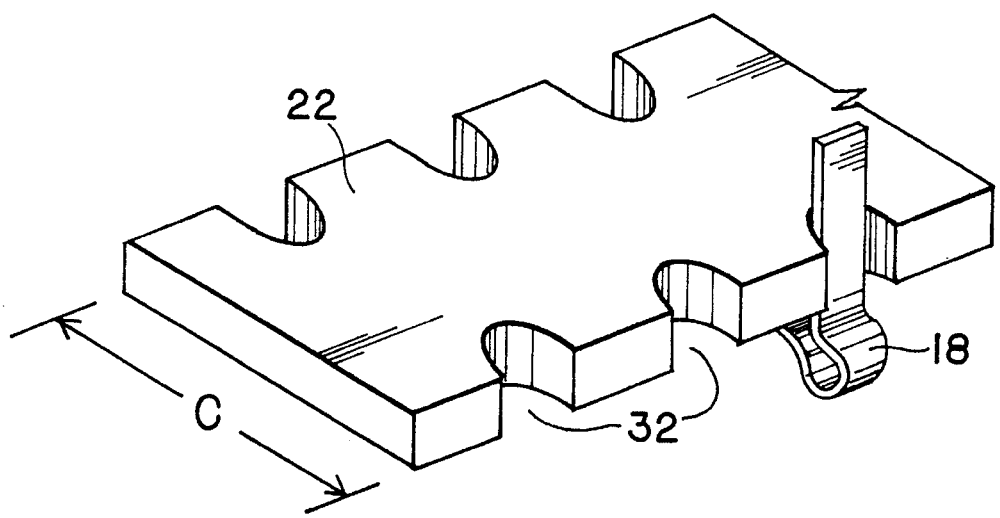
FIG. 3 is a perspective view of a portion of the spacer shown in FIG. 2.

In another embodiment, shown in FIG. 2, spacer 22 is affixed to the lower major surface 17 of the lowermost integrated circuit package 15 in module 10 by a high temperature adhesive layer 33. In this embodiment, spacer 22 includes coves or arcuate openings 32 (FIG. 3) formed along the perimeter of spacer 22 which are aligned with and adapted to receive rails 18. Each cove 32 will receive a single rail 18. Spacer 22 is formed so that dimension C (FIG. 3) is slightly greater than the width of packages 12. Spacer 22 when assembled in module 10, extends beyond edge 31 (FIG. 2) of package 12 to engage rails 18 (FIG. 3). In this manner, spacer 22 positions and stabilizes rails 18. In this embodiment, spacer 22 is preferably formed of FR-4 plastic or other high temperature molded plastic. As shown in FIG. 3, openings 32 are curved so as to provide self-centering and greater tolerance for locating rails 18 during assembly. Spacer 22 may alternatively be located at other levels in the module as between the second and third package 12.

Figure 4:
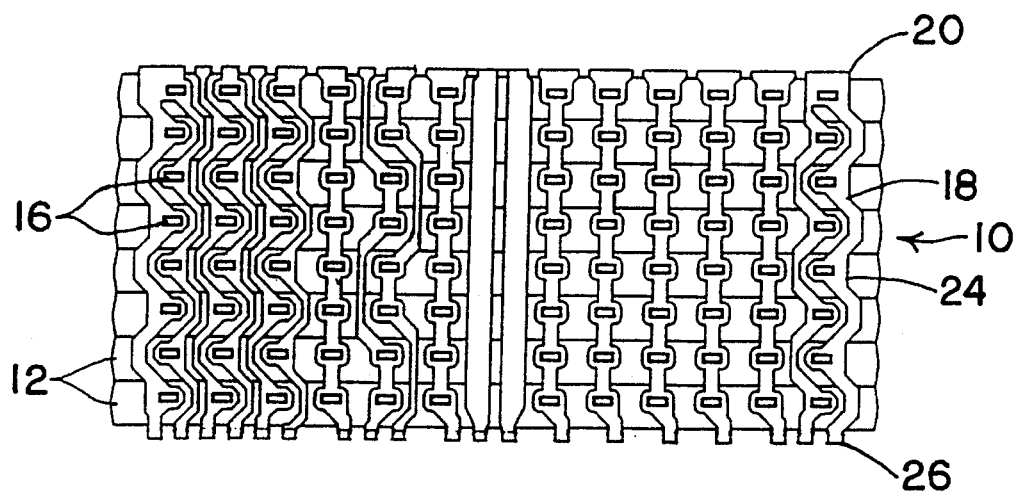
FIG. 4 is a side view of an embodiment of the present invention utilizing rail assemblies in a serpentine configuration.

FIG. 4 illustrates another embodiment for rails 18 wherein rails 18 are formed in a complex geometric or serpentine configuration. As shown in FIG. 4, individual rails 18 connect with leads 16 from every other integrated circuit package 12 within module 10, or connect with leads 16 from every other pair of integrated circuit packages 12 within module 10, or interconnect otherwise as shown in FIG. 4. This embodiment of a complex rail assembly is more fully described in commonly copending application Ser. No. 08/377,578, filed Jan. 24, 1995, pending, entitled "High Density Integrated Circuit Module With Complex Electrical Interconnect Rails," the contents of which are incorporated herein by references for all purposes.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. An integrated circuit module, comprising:

a plurality of stacked integrated circuit packages, wherein each said package includes a casing, an integrated circuit die disposed within said casing and a plurality of electrical interconnect leads; and a plurality of electrically and thermally conductive rails, each said rail including:
  (a) an upper portion which extends over the upper major surface of the uppermost of said integrated circuit packages in said module,
  (b) a central portion connected to said upper portion, said central portion being electrically coupled to selected ones of said electrical interconnect leads,
  (c) a lower portion connected to said central portion, said lower portion being in surface contact with the lower major surface of the lowermost of said integrated circuit packages in said module; and
  (d) a spring-bias portion to provide a spring-bias force in said rails.

2. The module of claim 1, further comprising a planar spacer, said spacer being mounted between said upper major surface of the uppermost of said integrated circuit packages and said upper portion of said rails.

3. The module of claim 2, further comprising an adhesive layer between said upper portion of each said rail assembly and said spacer.

4. The module of claim 1, wherein said spring-bias portion of said rails comprise an accurate segment formed between said central portion and said lower portion of said rails.

5. An integrated circuit module, comprising:

a plurality of stacked integrated circuit packages, wherein each said package includes a casing, an integrated circuit die disposed within said casing, and a plurality of electrical interconnect leads extending from said die through said casing; and a plurality of electrically and thermally conductive rails, each said rails including:
  (a) an upper portion which extends over and is in surface contact with the upper major surface of the uppermost of said integrated circuit packages in said module,
  (b) a central portion connected to said upper portion, said central portion being electrically and thermally connected to selected ones of said electrical interconnect leads,
  (c) a lower portion connected to said central portion, said lower portion extending over the lower major exterior surface of the lowermost of said integrated circuit packages in said module; and
  (d) a spring-bias portion to provide a spring bias force in said rails to mount said rails to said module;

a planar spacer element mounted between said lower rail portion and the lower major exterior surface of the lowermost of said integrated circuit packages, said spacer having a plurality of apertures formed about the periphery thereof, said apertures being adapted to receive and position said rails in said module.

6. The module of claim 5, wherein said apertures are formed along the perimeter of said spacer to coincide with said rail assemblies such that each of said apertures is adapted to receive a single said rail assembly.

7. The module of claim 5, further comprising a high temperature adhesive layer disposed between said spacer and said lower major surface of said lowermost integrated circuit package.

8. The module of claim 5, wherein said spacer comprises a high temperature plastic material.

9. The module of claim 5, wherein one or more of said rails interconnects only with a said lead from every other integrated circuit package.

10. The module of claim 5, wherein one or more of said rails interconnects only with leads of every other pair of integrated circuit packages in said module.

11. The module of claim 5, wherein one or more of said rails interconnects only with leads of every other triplet of integrated circuit packages in said module.

12. The module of claim 5, wherein one or more of said rails are electrically connected together.

13. The module of claim 1, wherein one or more of said rails interconnects only with a said lead from every other integrated circuit package.

14. The module of claim 1, wherein one or more of said rails interconnects only with leads of every other pair of integrated circuit packages in said module.

15. The module of claim 1, wherein one or more of said rails interconnects only with leads of every other triplet of integrated circuit packages in said module.

16. The module of claim 1, wherein one or more pairs of said rails are electrically connected together.

17. A vertical electrical and thermally conductive rail assembly of the type used to interconnect leads extending from a multi-level integrated circuit module, comprising a plurality of conductive rails, each said rail comprising:

an upper portion which extends over the top of a multi-level integrated circuit module;

a central portion which is connected to said upper portion of said rail and has means adapted to be electrically and thermally connected to interconnect leads extending from said multi-level integrated circuit module;

a lower portion connected to said central portion, wherein said lower portion is adapted to extend beneath said multi-level integrated circuit module and is adapted to be in surface contact with said multi-level integrated circuit module; and a spring-bias portion between said central portion and said lower portion for providing a spring-bias force on said rail.

* * * * *

UNITED STATES PATENT AND TRADEMARK OFFICE
CERTIFICATE OF CORRECTION

PATENT NO. : 5,499,160
DATED : March 12, 1996
INVENTOR(S) : Carmen D. Burns

It is certified that error appears in the above-indentified patent and that said Letters Patent is hereby corrected as shown below:

Column 2, line 60, delete "one-rail" and insert therefor -- one mil -- .

Column 6, line 1, delete "which extends" and insert therefor -- adapted to extend -- .

Signed and Sealed this

Thirteenth Day of August, 1996

Attest:

BRUCE LEHMAN

Attesting Officer            Commissioner of Patents and Trademarks